(12) United States Patent
Huang et al.

(10) Patent No.: US 10,411,581 B1
(45) Date of Patent: Sep. 10, 2019

(54) SWITCHING POWER CONVERSION APPARATUS AND MULTI-LEVEL SWITCHING POWER CONVERTER CIRCUIT THEREIN

(71) Applicant: RICHTEK TECHNOLOGY CORPORATION, Zhubei, Hsinchu (TW)

(72) Inventors: Wei-Jen Huang, Zhubei (TW); Shun-Yu Huang, Nantou (TW)

(73) Assignee: RICHTEK TECHNOLOGY CORPORATION, Zhubei, Hsinchu (TW)

( * ) Notice: Subject to any disclaimer, the term of this patent is extended or adjusted under 35 U.S.C. 154(b) by 0 days.

(21) Appl. No.: 16/220,305

(22) Filed: Dec. 14, 2018

Related U.S. Application Data

(60) Provisional application No. 62/637,428, filed on Mar. 2, 2018.

(30) Foreign Application Priority Data

Oct. 22, 2018 (CN) .......................... 2018 1 1228287

(51) Int. Cl.
*H02M 1/096* (2006.01)
*H03K 17/042* (2006.01)
*H03K 7/08* (2006.01)
*H02M 1/08* (2006.01)

(52) U.S. Cl.
CPC .............. *H02M 1/096* (2013.01); *H03K 7/08* (2013.01); *H03K 17/04206* (2013.01); *H02M 1/08* (2013.01)

(58) Field of Classification Search
CPC . H03K 17/042; H03K 17/04206; H02M 1/08; H02M 1/088; H02M 1/096
See application file for complete search history.

(56) References Cited

U.S. PATENT DOCUMENTS

| | | | | |
|---|---|---|---|---|
| 9,548,648 B2* | 1/2017 | Amaro | ..................... | H02M 1/08 |
| 2016/0043642 A1* | 2/2016 | Xu | ........................... | H02M 1/08 |
| | | | | 323/271 |
| 2018/0183330 A1* | 6/2018 | Assaad | ................. | H02M 3/158 |

* cited by examiner

*Primary Examiner* — Matthew V Nguyen
(74) *Attorney, Agent, or Firm* — Tung & Associates

(57) ABSTRACT

A switching power conversion apparatus includes: a multi-level power stage, a PWM control circuit, a multi-level driver circuit, a bootstrap capacitor control circuit and a driving power control circuit. The bootstrap capacitor control circuit includes bootstrap capacitor control switches. During a charging period, a bootstrap control signal controls the bootstrap capacitor control switches, to electrically connect a second bootstrap node to the ground voltage level, whereby the supply voltage charges the bootstrap capacitor via the bootstrap diode. During a pumping period, the bootstrap control signal controls the bootstrap capacitor control switches to electrically connect the second bootstrap node to one of the upper-gate nodes or the switching node, whereby the voltage of the first bootstrap node is pumped to a corresponding pumping voltage level.

28 Claims, 8 Drawing Sheets

US 10,411,581 B1

SWITCHING POWER CONVERSION APPARATUS AND MULTI-LEVEL SWITCHING POWER CONVERTER CIRCUIT THEREIN

CROSS REFERENCE

The present invention claims priority to U.S. 62/637,428, filed on Mar. 2, 2018, and CN 201811228287.8, filed on Oct. 22, 2018.

BACKGROUND OF THE INVENTION

Field of Invention

The present invention relates to a switching power conversion apparatus and a multi-level switching power converter circuit therein. In particular, the present invention relates to such switching power conversion apparatus and multi-level switching power converter circuit, which are capable of efficiently controlling upper-gate switches and lower-gate switches having same conductivity types.

Description of Related Art

Please refer to FIG. 1A and FIG. 1B. FIG. 1A shows a block diagram of a prior art buck switching power conversion apparatus. FIG. 1B shows a block diagram of a prior art boost switching power conversion apparatus.

As shown in FIG. 1A, the prior art buck switching power conversion apparatus 100A has a 3-level power stage 11. The 3-level power stage 11 includes: an upper-gate switch P1, an upper-gate switch P2, a lower-gate switch N1 and a lower-gate switch N2. The upper-gate switch P1 and the upper-gate switch P2 are connected in series to form an upper-gate switch group 111, while the lower-gate switch N1 and the lower-gate switch N2 are connected in series to form a lower-gate switch group 112.

Similarly, as shown in FIG. 1B, the prior art boost switching power conversion apparatus 100B has a 3-level power stage 11. The 3-level power stage 11 includes: an upper-gate switch P1, an upper-gate switch P2, a lower-gate switch N1 and a lower-gate switch N2. The upper-gate switch P1 and the upper-gate switch P2 are connected in series to form an upper-gate switch group 111, while the lower-gate switch N1 and the lower-gate switch N2 are connected in series to form a lower-gate switch group 112.

In addition, both the prior art buck switching power conversion apparatus 100A and the prior art boost switching power conversion apparatus 100B further include a PWM controller 12, which controls the operations of the upper-gate switch group 111 and the lower-gate switch group 112, to convert an input voltage VIN provided at an input terminal VIN (as shown by one terminal of the upper-gate switch P2 in FIG. 1A) to an output voltage VOUT at an output terminal VOUT. Similarly, the prior art boost switching power conversion apparatus 100B also converts an input voltage VIN provided at an input terminal VIN (as shown by one terminal of the inductor in FIG. 1B) to an output voltage VOUT at an output terminal VOUT.

The aforementioned prior art switching power conversion apparatuses have a drawback that: both the upper-gate switch P1 and the upper-gate switch P2 are PMOS transistor switches which have a relatively higher conduction resistance; hence, the power conversion efficiency is low and the cost is high.

In view of the above, to overcome the drawback in the prior art switching power conversion apparatuses, the present invention provides a switching power conversion apparatus including an upper-gate switch group and a lower-gate switch group formed by NMOS transistor switches, and because the conduction resistance of an NMOS transistor switch is small, the present invention is thus more efficient and more cost-effective than the prior art switching power conversion apparatuses.

SUMMARY OF THE INVENTION

From one perspective, the present invention provides a switching power conversion apparatus which is configured to operably convert a first voltage to a second voltage or convert the second voltage to the first voltage, the switching power conversion apparatus comprising: an inductor having one end electrically connected to the second voltage and having another end electrically connected to a switching node; a multi-level switching power converter circuit coupled to the inductor via the switching node; a conversion capacitor, which is coupled to the multi-level switching power converter circuit; a bootstrap diode having a current input terminal coupled to a supply voltage and having a current output terminal coupled to a first bootstrap node; and a bootstrap capacitor having one end coupled to the first bootstrap node, and having another end which is coupled to the multi-level switching power converter circuit via a second bootstrap node; wherein the multi-level switching power converter circuit includes: a multi-level power stage, including: a plurality of upper-gate switches which are connected in series to form an upper-gate switch group, the upper-gate switch group being coupled between the first voltage and the switching node, wherein the upper-gate switch group includes one or more upper-gate nodes, and each one of the upper-gate nodes is coupled between two corresponding upper-gate switches; and a plurality of lower-gate switches which are connected in series to form a lower-gate switch group, the lower-gate switch group being coupled between a ground voltage level and the switching node, wherein the lower-gate switch group includes one or more lower-gate nodes, and each one of the lower-gate nodes is coupled between two corresponding lower-gate switches; wherein, the conversion capacitor having one end coupled to one of the upper-gate nodes and having another end coupled to one of the lower-gate nodes; wherein, the plurality of upper-gate switches and the plurality of lower-gate switches are configured to operably switch a coupling relationship among the conversion capacitor, the inductor, the first voltage, the switching node and the ground voltage level, so that a voltage of the switching node is switched among at least three switching voltage levels, thereby achieving multi-level switching power conversion to convert the first voltage to the second voltage or convert the second voltage to the first voltage; a pulse width modulation (PWM) control circuit, which is configured to operably generate a PWM signal and a bootstrap control signal; a multi-level driver circuit, which includes a plurality of sub-driver circuits configured to operably generate a plurality of corresponding upper-gate driving signals and a plurality of corresponding lower-gate driving signals according to the PWM signal, wherein the plurality of upper-gate driving signals and the plurality of lower-gate driving signals are configured to operably drive the corresponding upper-gate switches and the corresponding lower-gate switches, respectively; a bootstrap capacitor control circuit including a plurality of bootstrap capacitor control switches, wherein the bootstrap capacitor control switches are coupled together at a first end of each of the bootstrap capacitor control switches, whereas, each of the bootstrap capacitor control switches has a second end and the second ends are coupled to one of the upper-gate nodes, the corresponding switch node and the corresponding ground voltage level, respectively; wherein, during a charging period, the bootstrap control signal controls the plurality of bootstrap capacitor control switches to electrically connect the second bootstrap node to the ground voltage level, whereby the supply voltage charges the bootstrap capacitor via the bootstrap diode, and wherein, during a pumping period, the bootstrap control signal controls the plurality of bootstrap capacitor control switches to electrically connect the second bootstrap node to one of the upper-gate nodes or the switching node, whereby the voltage of the first bootstrap node is pumped to a corresponding pumping voltage level; and a driving power control circuit including a plurality of driving power control switches, wherein during the pumping period, the bootstrap control signal controls the plurality of driving power control switches to supply the voltage of the first bootstrap node as a power for corresponding ones of the sub-driver circuits, such that the corresponding ones of the sub-driver circuits generate corresponding driving signals to drive the upper-gate switches.

From another perspective, the present invention provides a multi-level switching power converter circuit for use in a switching power conversion apparatus, the switching power conversion apparatus being configured to operably convert a first voltage to a second voltage or convert the second voltage to the first voltage, the switching power conversion apparatus comprising: an inductor having one end electrically connected to the second voltage and having another end electrically connected to a switching node; a conversion capacitor, which is coupled to the multi-level switching power converter circuit; a bootstrap diode having a current input terminal coupled to a supply voltage and having a current output terminal coupled to a first bootstrap node; and a bootstrap capacitor having one end coupled to the first bootstrap node, and having another end which is coupled to the multi-level switching power converter circuit via a second bootstrap node; the multi-level switching power converter circuit being coupled to the inductor via the switching node, and the multi-level switching power converter circuit comprising: a multi-level power stage, including: a plurality of upper-gate switches which are connected in series to form an upper-gate switch group, the upper-gate switch group being coupled between the first voltage and the switching node, wherein the upper-gate switch group includes one or more upper-gate nodes, and each one of the upper-gate nodes is coupled between two corresponding upper-gate switches; and a plurality of lower-gate switches which are connected in series to form a lower-gate switch group, the lower-gate switch group being coupled between a ground voltage level and the switching node, wherein the lower-gate switch group includes one or more lower-gate nodes, and each one of the lower-gate nodes is coupled between two corresponding lower-gate switches; wherein, the conversion capacitor having one end coupled to one of the upper-gate nodes and having another end coupled to one of the lower-gate nodes; wherein, the plurality of upper-gate switches and the plurality of lower-gate switches are configured to operably switch a coupling relationship among the conversion capacitor, the inductor, the first voltage, the switching node and the ground voltage level, so that a voltage of the switching node is switched among at least three switching voltage levels, thereby achieving multi-level switching power conversion to convert the first voltage to the second voltage or convert the second voltage to the first voltage; a pulse width modulation (PWM) control circuit, which is configured to operably generate a PWM signal and a bootstrap control signal; a multi-level driver circuit, which includes a plurality of sub-driver circuits configured to operably generate a plurality of corresponding upper-gate driving signals and a plurality of corresponding lower-gate driving signals according to the PWM signal, wherein the plurality of upper-gate driving signals and the plurality of lower-gate driving signals are configured to operably drive the corresponding upper-gate switches and the corresponding lower-gate switches, respectively; a bootstrap capacitor control circuit including a plurality of bootstrap capacitor control switches, wherein the bootstrap capacitor control switches are coupled together at a first end of each of the bootstrap capacitor control switches, whereas, each of the bootstrap capacitor control switches has a second end and the second ends are coupled to one of the upper-gate nodes, the switch node and the ground voltage level, respectively; wherein, during a charging period, the bootstrap control signal controls the plurality of bootstrap capacitor control switches to electrically connect the second bootstrap node to the ground voltage level, whereby the supply voltage charges the bootstrap capacitor via the bootstrap diode, and wherein, during a pumping period, the bootstrap control signal controls the plurality of bootstrap capacitor control switches to electrically connect the second bootstrap node to one of the upper-gate nodes or the switching node, whereby the voltage of the first bootstrap node is pumped to a corresponding pumping voltage level; and a driving power control circuit including a plurality of driving power control switches, wherein during the pumping period, the bootstrap control signal controls the plurality of driving power control switches to supply the voltage of the first bootstrap node as a power for corresponding ones of the sub-driver circuits, such that the corresponding ones of the sub-driver circuits generate corresponding driving signals to drive the upper-gate switches.

In one embodiment, the at least three switching voltage level includes a voltage level which is 1/k of a voltage level of the first voltage, in which k is a real number.

In one embodiment, the at least three switching voltage level includes a voltage level which is ½ of a voltage level of the first voltage, the voltage level of the first voltage and the ground voltage level.

In one embodiment, the multi-level power stage includes a first upper-gate switch, a second upper-gate switch, a first lower-gate switch and a second lower-gate switch; wherein, the first upper-gate switch and the second upper-gate switch are coupled in series between the first voltage and the switching node, to form the upper-gate switch group, the first upper-gate switch and the second upper-gate switch being commonly coupled to the corresponding upper-gate node; the first lower-gate switch and the second lower-gate switch are coupled in series between the ground voltage level and the switching node, to form the lower-gate switch group, the first lower-gate switch and the second lower-gate switch being commonly coupled to the corresponding lower-gate node; and the conversion capacitor is coupled between the upper-gate node and the lower-gate node.

In one embodiment, the plurality of sub-driver circuits includes a first upper-gate driver circuit, a second upper-gate driver circuit, a first lower-gate driver circuit and a second lower-gate driver circuit, which are configured to operably generate the plurality of upper-gate driving signals and the plurality of lower-gate driving signals according to the PWM signal, respectively; wherein, the plurality of upper-gate driving signals include a first upper-gate driving signal and a second upper-gate driving signal, which are configured to operably control the first upper-gate switch and the second upper-gate switch, respectively; wherein, the plurality of lower-gate driving signals includes a first lower-gate driving signal and a second lower-gate driving signal, which are configured to operably control the first lower-gate switch and the second lower-gate switch, respectively.

In one embodiment, the plurality of bootstrap capacitor control switches includes a first bootstrap capacitor control switch, a second bootstrap capacitor control switch and a third bootstrap capacitor control switch; wherein, each of the first bootstrap capacitor control switch, the second bootstrap capacitor control switch and the third bootstrap capacitor control switch has one end coupled to the second bootstrap node; wherein, the first bootstrap capacitor control switch has its another end coupled to the upper-gate node, the second bootstrap capacitor control switch has its another end coupled to the switching node and the third bootstrap capacitor control switch has its another end coupled to the ground voltage level; wherein, to drive the first upper-gate switch, a first phase period is first entered; during the first phase period, the bootstrap control signal controls the first bootstrap capacitor control switch, the second bootstrap capacitor control switch and the third bootstrap capacitor control switch, so as to electrically connect the second bootstrap node to the ground voltage level, whereby the supply voltage charges the bootstrap capacitor via the bootstrap diode; thereafter, a third phase period is entered; during the third phase period, the second bootstrap node is electrically connected to the upper-gate node, whereby the voltage of the first bootstrap node is pumped to a first pumping voltage level, so that the first pumping voltage level is supplied as a power for driving the first upper-gate driver circuit; wherein, to drive the second upper-gate switch, the first phase period is entered; during the first phase period, the bootstrap control signal controls the first bootstrap capacitor control switch, the second bootstrap capacitor control switch and the third bootstrap capacitor control switch, so as to electrically connect the second bootstrap node to the ground voltage level, whereby the supply voltage charges the bootstrap capacitor via the bootstrap diode; thereafter, a second phase period is entered; during the second phase period, the second bootstrap node is electrically connected to the switching node, whereby the voltage of the first bootstrap node is pumped to a second pumping voltage level, so that the second pumping voltage level is supplied as a power for driving the second upper-gate driver circuit; wherein, the first pumping voltage level is related to the supply voltage and the voltage of the first bootstrap node, whereas, the second pumping voltage level is related to the supply voltage and the voltage of the switching node; wherein, the first phase period corresponds to the charging period, whereas, the second phase period and/or the third phase period corresponds to the pumping period.

In one embodiment, the plurality of driving power control switches include: a first driving power control switch and a second driving power control switch; wherein, the first driving power control switch and the second driving power control switch have their one end commonly coupled to the first bootstrap node, the first driving power control switch having its another end coupled to the first upper-gate driver circuit, the second driving power control switch having its another end coupled to the second upper-gate driver circuit; wherein, to drive the first upper-gate switch, during the third phase period, the bootstrap control signal controls the first driving power control switch, so as to supply the voltage of the first bootstrap node as the power for the first driving power control switch; accordingly, the first driving power control switch generates the first upper-gate switch signal for driving the first upper-gate switch; and wherein, to drive the second upper-gate switch, during the second phase period, the bootstrap control signal controls the second driving power control switch, so as to supply the voltage of the first bootstrap node as the power for the second driving power control switch; accordingly, the second driving power control switch generates the second upper-gate switch signal for driving the second upper-gate switch.

In one embodiment, the sub-driver circuits adopt the voltage of the switching node and the voltage of the one or more upper-gate nodes as a negative power, respectively, whereby a voltage across the bootstrap capacitor supplies power to the sub-driver circuits in a time-shared manner to drive the upper-gate switches respectively.

In one embodiment, each of the upper-gate switches is controlled to be conductive when the voltage of the first bootstrap node is pumped to the corresponding pumping voltage level and when the first pumping voltage level is supplied as the power for driving the sub-driver circuit corresponding to the upper-gate switch.

In one embodiment, each of the upper-gate switches is controlled to be conductive when the voltage of the first bootstrap node is pumped to the corresponding pumping voltage level and when the first pumping voltage level is supplied as the power for driving the sub-driver circuit corresponding to the upper-gate switch; and after the upper-gate switch is controlled to be conductive, the corresponding sub-driver circuit controls the corresponding driving signal to be floating and maintain the upper-gate switch to be conductive.

In one embodiment, when the driving signal is controlled to be floating and the corresponding upper-gate switch is maintained to be conductive, during another charging period, the bootstrap capacitor is charged with the supply voltage via the bootstrap diode; and, during another pumping period, when the voltage of the first bootstrap node is pumped to another corresponding pumping voltage level and when the voltage of the first bootstrap node is supplied as the power for another sub-driver circuit corresponding to another upper-gate switch, the another upper-gate switches is controlled to be conductive.

In one embodiment, the voltage of the switching node and/or the voltage of the at least one upper-gate node is a variable.

In one embodiment, the plurality of upper-gate switches and the plurality of lower-gate switches include transistor switches having same conductivity types.

In one embodiment, the plurality of upper-gate switches and the plurality of lower-gate switches includes NMOS transistor switches.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the circuits and between the signal waveforms, but not drawn according to actual scale of circuit sizes and signal amplitudes and frequencies.

Figure 1A:
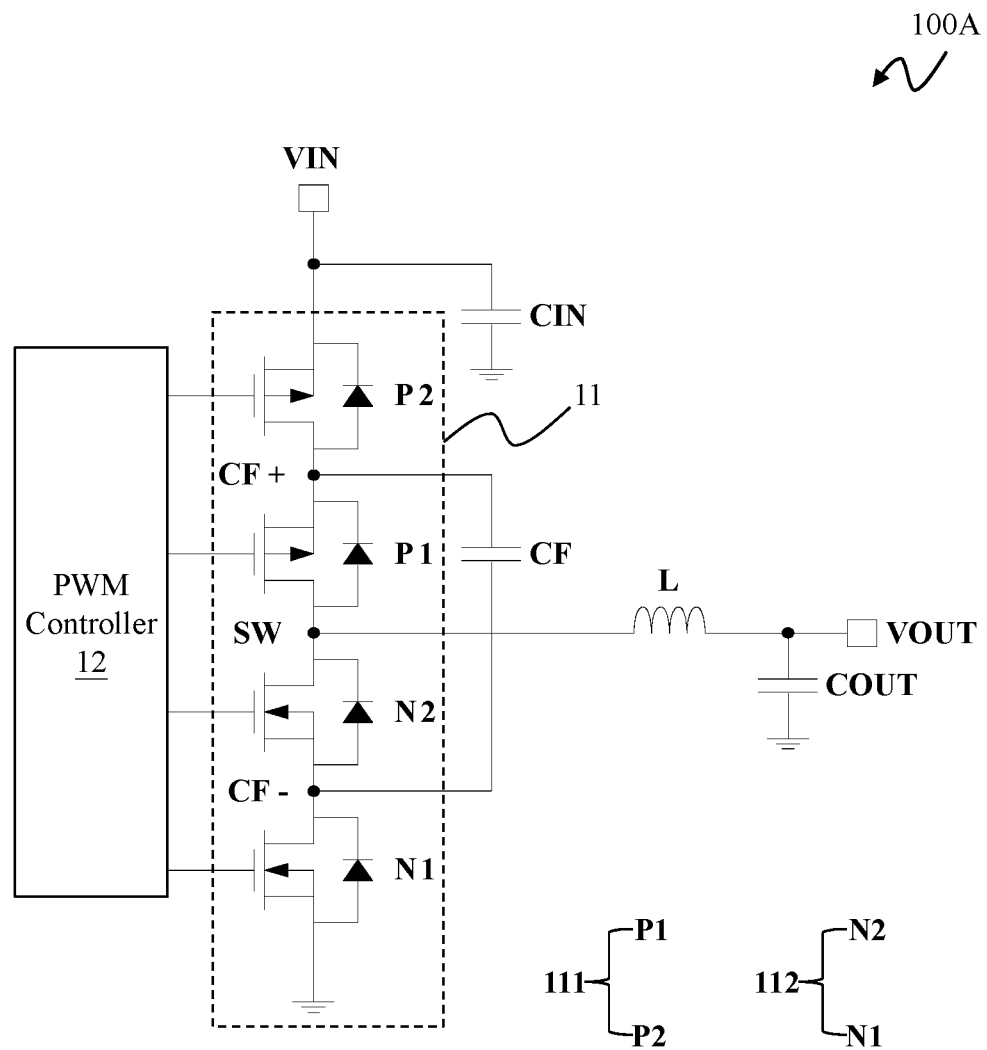
FIG. 1A shows a block diagram of a prior art buck switching power conversion apparatus.
Figure 1B:
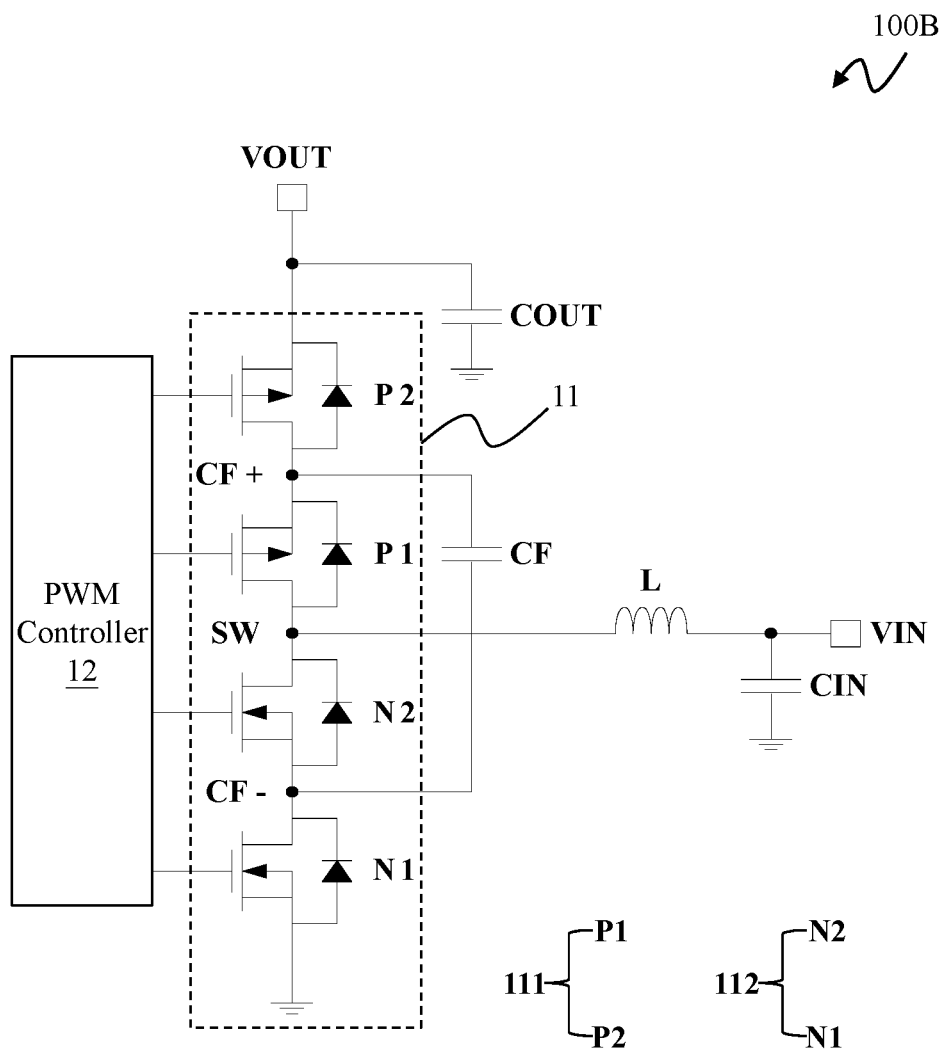
FIG. 1B shows a block diagram of a prior art boost switching power conversion apparatus.
Figure 2:
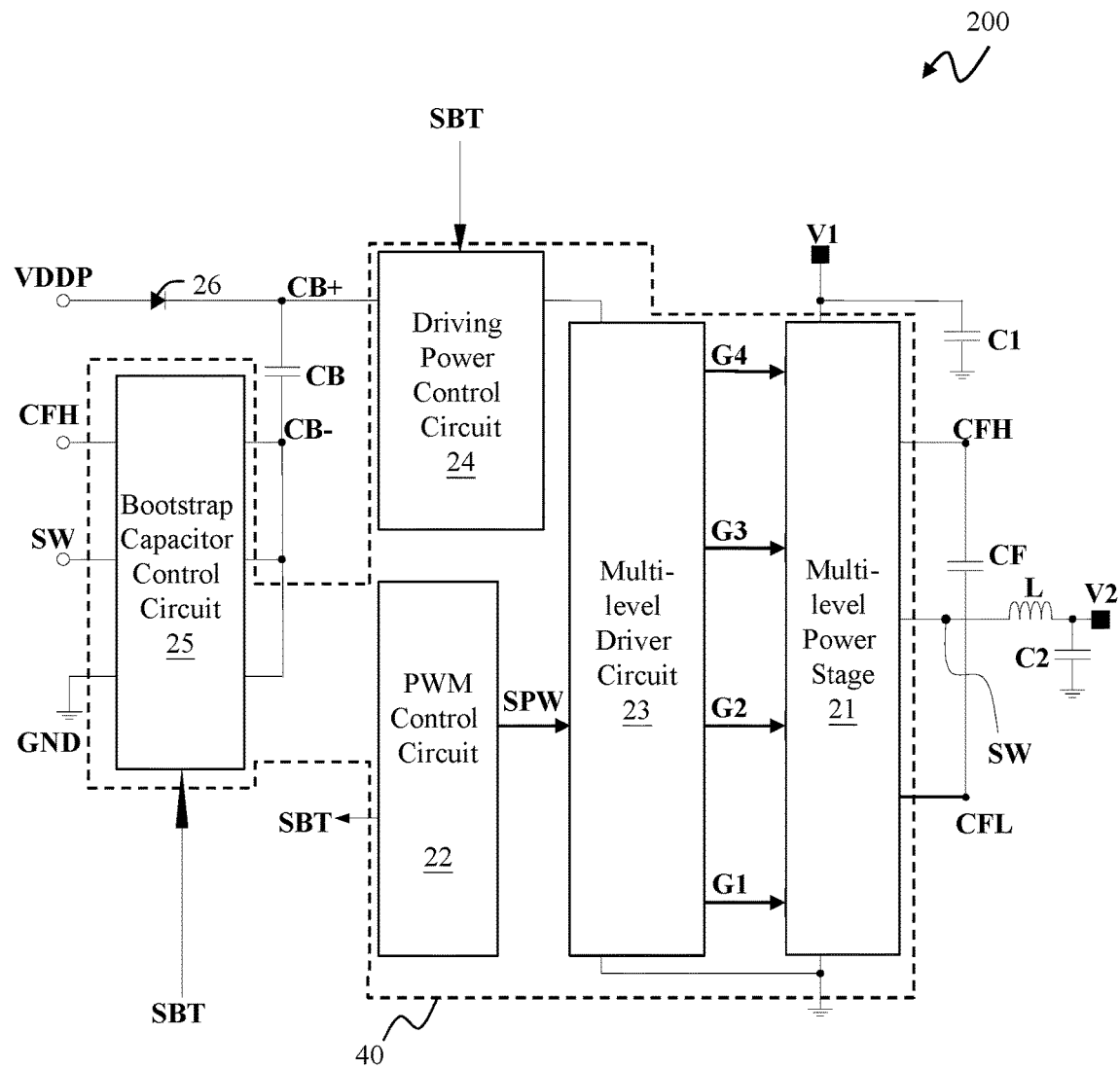
FIG. 2 shows a block diagram of a switching power conversion apparatus according to an embodiment of the present invention.

Please refer to FIG. 2, which shows a block diagram of a switching power conversion apparatus according to an embodiment of the present invention.

As shown in FIG. 2, the switching power conversion apparatus 200 is configured to operably convert a first voltage V1 to a second voltage V2 or convert the second voltage V2 to the first voltage V1.

In one application wherein the first voltage V1 is an input voltage and the second voltage V2 is an output voltage, the switching power conversion apparatus 200 of the present invention can perform, for example but not limited to, buck switching power conversion. Under such circumstance, this buck switching power conversion apparatus 200 is configured to operably perform buck conversion, to convert the input voltage V1 provided at the input terminal V1 to the output voltage V2 at the output terminal V2.

In another application wherein the first voltage V1 is an output voltage and the second voltage V2 is an input voltage, the switching power conversion apparatus 200 of the present invention can perform, for example but not limited to, boost switching power conversion. Under such circumstance, this boost switching power conversion apparatus 200 is configured to operably perform boost conversion, to convert the input voltage V2 provided at the input terminal V2 to the output voltage V1 at the output terminal V1.

The switching power conversion apparatus 200 of the present invention comprises: an inductor L, a multi-level switching power converter circuit 40, a conversion capacitor CF, a bootstrap diode 26 and a bootstrap capacitor CB.

As shown in FIG. 2, the inductor L has one end electrically connected to the second voltage V2 and has another end electrically connected to a switching node SW. The multi-level switching power converter circuit 40 and the inductor L are commonly coupled to the switching node SW. The conversion capacitor CF is coupled to the multi-level switching power converter circuit 40. The bootstrap diode 26 has a current input terminal coupled to a supply voltage VDDP and has a current output terminal coupled to a first bootstrap node CB+. The bootstrap capacitor CB has one end coupled to the first bootstrap node CB+, and, another end of the bootstrap capacitor CB and the multi-level switching power converter circuit 40 are coupled to a second bootstrap node CB−.

As shown in FIG. 2, in one embodiment, the multi-level switching power converter circuit 40 of the switching power conversion apparatus 200 includes: a multi-level power stage 21, a pulse width modulation (PWM) control circuit 22, a multi-level driver circuit 23, a driving power control circuit 24 and a bootstrap capacitor control circuit 25. In one embodiment, preferably, the multi-level switching power converter circuit 40 can be integrated into an integrated circuit chip.

In the present invention, as one of average skill in the art will readily appreciate, the term "multi-level", as used herein, can be at least three-level or more than three-level. That is, the term "multi-level", as used herein, can be three-level, four-level, five-level, . . . , or N-level, wherein N is a positive integer which is greater than or equal to three.

For simplicity in explaining the spirit of the invention, the following description will take "three-level" as an example of "multi-level".

Figure 3:
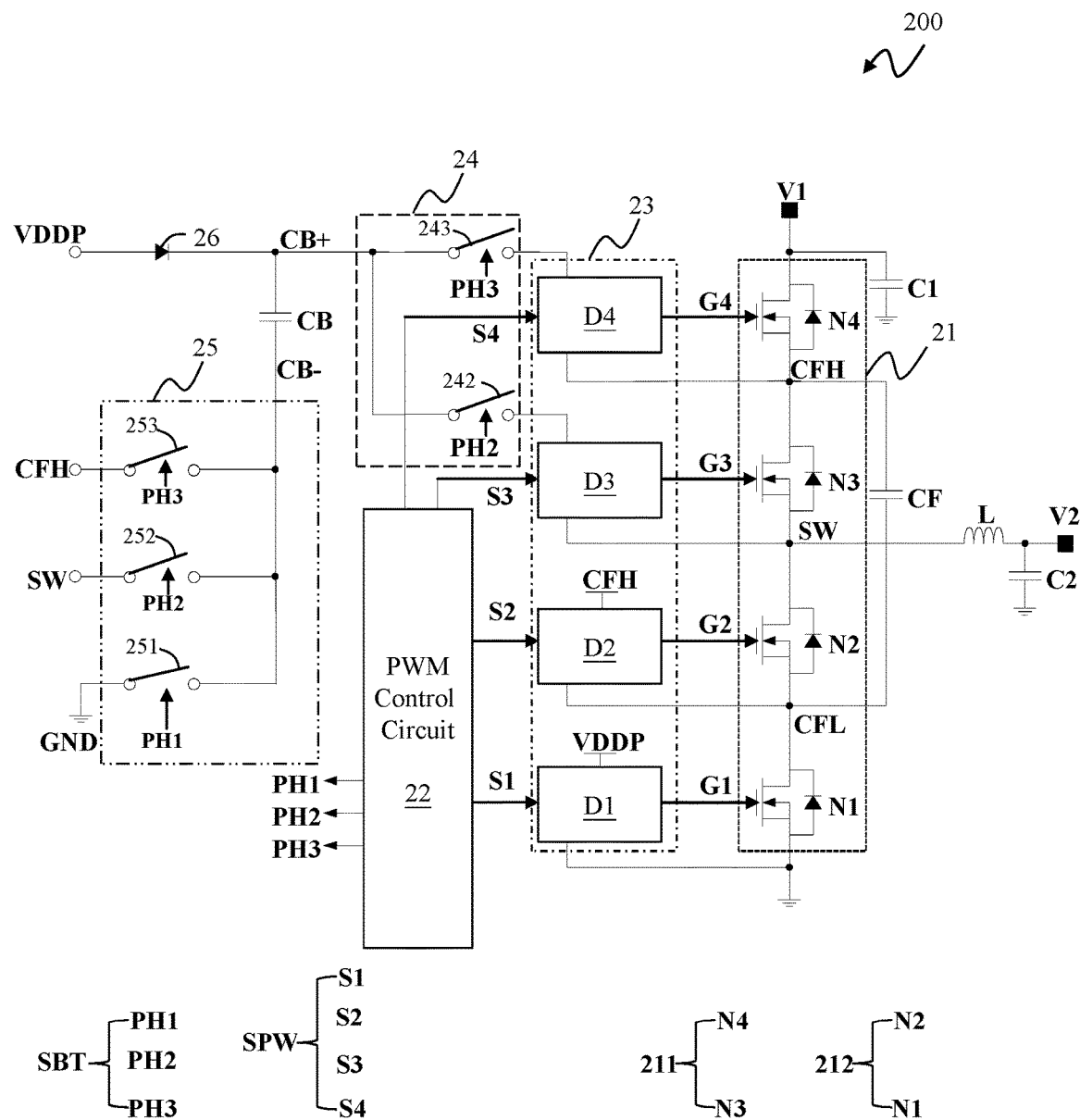
FIG. 3 shows a block diagram of a switching power conversion apparatus according to a specific embodiment of the present invention.

Please refer to FIG. 3, which shows a block diagram of a switching power conversion apparatus according to a specific embodiment of the present invention.

In the embodiment shown in FIG. 3, the "multi-level" switching power converter circuit 40, the "multi-level" power stage 21 and the "multi-level" driver circuit 23 are illustrated as "three-level" as examples.

In the embodiment shown in FIG. 3, the three-level power stage 21 includes: two upper-gate switches (i.e., an upper-gate switch N4 and an upper-gate switch N3) and two lower-gate switches (i.e., a lower-gate switch N2 and a lower-gate switch N1). The upper-gate switch N4 and the upper-gate switch N3 are connected in series to form an upper-gate switch group 211. The upper-gate switch group 211 is coupled between the first voltage V1 and the switching node SW. The upper-gate switch group 211 includes an upper-gate node CFH; in the embodiment shown in FIG. 3, the upper-gate node CFH is coupled between the two upper-gate switches (i.e., the upper-gate switch N4 and the upper-gate switch N3), or speaking alternatively, the upper-gate switch N4 and the upper-gate switch N3 are commonly coupled to the upper-gate node CFH. The lower-gate switch N2 and the lower-gate switch N1 are connected in series to form a lower-gate switch group 212. The lower-gate switch group 212 is coupled between a ground voltage level GND and the switching node SW. The lower-gate switch group 212 includes a lower-gate node CFL; in the embodiment shown in FIG. 3, the lower-gate node CFL is coupled between the two lower-gate switches (i.e., the lower-gate switch N2 and the lower-gate switch N1), or speaking alternatively, the lower-gate switch N2 and the lower-gate switch N1 are commonly coupled to the lower-gate node CFL.

In one embodiment, the two upper-gate switches (i.e., the upper-gate switch N4 and the upper-gate switch N3) and the two lower-gate switches (i.e., the lower-gate switch N2 and the lower-gate switch N1) are transistor switches having same conductivity types. In one embodiment, the two upper-gate switches (i.e., the upper-gate switch N4 and the upper-gate switch N3) and the two lower-gate switches (i.e., the lower-gate switch N2 and the lower-gate switch N1) are NMOS transistor switches.

Still referring to FIG. 3, in this embodiment, the conversion capacitor CF has one end coupled to the upper-gate node CFH and has another end coupled to the lower-gate node CFL. That is, the conversion capacitor CF is coupled between the upper-gate node CFH and the lower-gate node CFL.

Figure 4A:
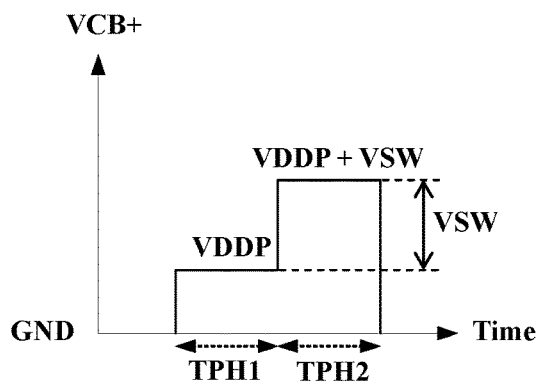
FIGS. 4A-4B show an arrangement of operation waveforms corresponding to the embodiment of FIG. 3.
Figure 4B:
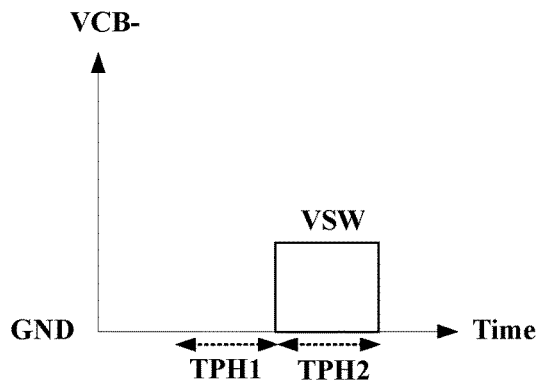

Still referring to FIG. 3, in this embodiment, the two upper-gate switches (i.e., the upper-gate switch N4 and the upper-gate switch N3) and the two lower-gate switches (i.e., the lower-gate switch N2 and the lower-gate switch N1) are configured to operably control the coupling relationship among the conversion capacitor CF, the inductor L, the first voltage V1, the switching node SW and the ground voltage level GND, so that a voltage VSW (referring to the voltage VSW as shown in FIGS. 4A-4B) of the switching node SW is switched among at least three switching voltage levels, to achieve three-level switching power conversion to thereby convert the first voltage V1 to the second voltage V2, or convert the second voltage V2 to the first voltage V1. In this embodiment, the three switching voltage levels include a voltage level which is ½ of a voltage level of the first voltage V1, the voltage level of the first voltage V1 and the ground voltage level GND.

The PWM control circuit 22 is configured to operably generate a PWM signal SPW and a bootstrap control signal SBT. The PWM signal SPW is for controlling the three-level driver circuit 23, whereas, the bootstrap control signal SBT is for controlling the driving power control circuit 24 and the bootstrap capacitor control circuit 25. The features and the details as to how the PWM signal SPW and the bootstrap control signal SBT control the three-level driver circuit 23, the driving power control circuit 24 and the bootstrap capacitor control circuit 25 will be described later.

In the embodiment shown in FIG. 3, the three-level driver circuit 23 includes four sub-driver circuits (i.e., an upper-gate driver circuit D4, an upper-gate driver circuit D3, a lower-gate driver circuit D2 and a lower-gate driver circuit D1), which are configured to operably generate two upper-gate driving signals G4 and G3 and two lower-gate driving signals G2 and G1 according to the PWM signal SPW, respectively. The two upper-gate driving signals G4 and G3 control the corresponding two upper-gate switches (i.e., the upper-gate switch N4 and the upper-gate switch N3), respectively, while the two lower-gate driving signals G2 and G1 control the corresponding two lower-gate switches (i.e., the lower-gate switch N2 and the lower-gate switch N1), respectively.

In the embodiment shown in FIG. 3, the bootstrap capacitor control circuit 25 includes, for example but not limited to, three bootstrap capacitor control switches (i.e., a bootstrap capacitor control switch 251, a bootstrap capacitor control switch 252 and a bootstrap capacitor control switch 253). One end of each of the bootstrap capacitor control switches 251, 252 and 253 is coupled to the second bootstrap node CB−. The bootstrap capacitor control switch 251 has its another end coupled to the upper-gate node CFH. The bootstrap capacitor control switch 252 has its another end coupled to the switch node SW. The bootstrap capacitor control switch 253 has its another end coupled to the ground voltage level GND.

In the embodiment shown in FIG. 3, the driving power control circuit 24 can include, for example but not limited to, two driving power control switches (i.e., a driving power control switch 242 and a driving power control switch 243). The driving power control switch 242 and the driving power control switch 243 have their one end commonly coupled to the first bootstrap node CB+. The driving power control switch 242 has its another end coupled to the upper-gate driver circuit D3, while, the driving power control switch 243 has its another end coupled to the upper-gate driver circuit D4.

To overcome the drawbacks in the prior art, in the present invention, the upper-gate switch group 211 have upper-gate switches (i.e., the upper-gate switch N4 and the upper-gate switch N3) which are NMOS transistor switches and the lower-gate switch group 212 have lower-gate switches (i.e., the lower-gate switch N2 and the lower-gate switch N1) which are NMOS transistor switches. Because the conduction resistance of an NMOS transistor switch is small, the present invention is more efficient and more cost-effective than the prior art.

To ensure that the two upper-gate driving signals G4 and G3 can properly drive the corresponding two upper-gate switches (i.e., the upper-gate switch N4 and the upper-gate switch N3), respectively, the present invention adopts the bootstrap capacitor control circuit 25 and the driving power control circuit 24 which ensure that the upper-gate driver circuit D4 and the upper-gate driver circuit D3 receive sufficient power (in particular, adequately high voltage level), such that the upper-gate driver circuit D4 and the upper-gate driver circuit D3 are capable of generating the corresponding upper-gate driving signals G4 and G3 with sufficient driving capability, for driving the corresponding upper-gate switch N4 and upper-gate switch N3.

The following description will explain the features and the details as to how the bootstrap capacitor control circuit 25 and the driving power control circuit 24 operate to ensure that the upper-gate driver circuit D4 and the upper-gate driver circuit D3 receive sufficient power, such that the upper-gate driver circuit D4 and the upper-gate driver circuit D3 are capable of generating the corresponding upper-gate driving signals G4 and G3 with sufficient driving capability, for driving the corresponding upper-gate switch N4 and upper-gate switch N3.

Please refer to FIGS. 4A-4B and FIGS. 5A-5B, which show an arrangement of operation waveforms corresponding to the embodiment of FIG. 3.

As shown in FIG. 3, in this embodiment, the bootstrap control signal SBT includes a first bootstrap control signal PH1, a second bootstrap control signal PH2 and a third bootstrap control signal PH3. The first bootstrap control signal PH1 controls the bootstrap capacitor control switch 251. The second bootstrap control signal PH2 controls the bootstrap capacitor control switch 252. The third bootstrap control signal PH3 controls the bootstrap capacitor control switch 253.

Referring to FIGS. 4A-4B, in this embodiment, to drive the upper-gate switch N3, a charging period is first entered (e.g., referring to the first phase period TPH1 as shown in FIGS. 4A-4B); during the charging period, the bootstrap control signal SBT controls the bootstrap capacitor control switches (the bootstrap capacitor control switches 251~253), so as to electrically connect the second bootstrap node CB− to the ground voltage level GND, whereby the supply voltage VDDP charges the bootstrap capacitor CB via the bootstrap diode 26. In the exemplary illustration of FIGS. 4A-4B, during the charging period, the first bootstrap control signal PH1 controls the bootstrap capacitor control switch 251 to be conductive. The second bootstrap control signal PH2 controls the bootstrap capacitor control switch 252 to be non-conductive. The third bootstrap control signal PH3 controls the bootstrap capacitor control switch 253 to be non-conductive. Consequently, the second bootstrap node CB− is electrically connected to the ground voltage level GND, whereby the supply voltage VDDP charges the bootstrap capacitor CB via the bootstrap diode 26. As shown in FIG. 4A, during the charging period (e.g., referring to the first phase period TPH1 as shown in FIG. 4A), the voltage level of the first bootstrap node CB+, which is VCB+, can be charged up to the voltage level of the supply voltage VDDP. As shown in FIG. 4B, during the charging period (e.g., referring to the first phase period TPH1 as shown in FIG. 4B), the voltage level of the second bootstrap node CB−, which is VCB−, is equal to GND. The first phase period TPH1 corresponds to the charging period.

Subsequently, a pumping period is entered (e.g., referring to the second phase period TPH2 as shown in FIGS. 4A-4B); the bootstrap control signal SBT controls the bootstrap capacitor control switches (e.g., the bootstrap capacitor control switches 251~253), so that during the pumping period, the second bootstrap node CB− is electrically connected to the switching node SW, whereby the voltage VCB+ of the first bootstrap node CB+ is pumped to a second pumping voltage level, which is supplied as a power for driving the upper-gate driver circuit D3. In the exemplary illustration of FIGS. 4A-4B, during the pumping period (e.g., referring to the second phase period TPH2 as shown in FIGS. 4A-4B), the second bootstrap control signal PH2 controls the bootstrap capacitor control switch 252 to be conductive. The first bootstrap control signal PH1 controls the bootstrap capacitor control switch 251 to be non-conductive. The third bootstrap control signal PH3 controls the bootstrap capacitor control switch 253 to be non-conductive. Consequently, the second bootstrap node CB− is electrically connected to the switching node SW, whereby the voltage VCB+ of the first bootstrap node CB+ is pumped to the second pumping voltage level, and the second pumping voltage level provides a power for driving the upper-gate driver circuit D3. The pumping period corresponds to the second phase period TPH2.

As shown in FIG. 4A, during the pumping period (e.g., referring to the second phase period TPH2 as shown in FIG. 4A), the second pumping voltage level is related to the supply voltage VDDP and the voltage VSW of the switching node SW. In the shown embodiment, the second pumping voltage level is equal to a sum of the supply voltage VDDP and the voltage VSW of the switching node SW (e.g., referring to FIG. 4A, the voltage level VCB+ is equal to a sum of the supply voltage VDDP and the voltage VSW of the switching node SW).

While driving the upper-gate switch N3, during the pumping period (e.g., referring to the second phase period TPH2 as shown in FIGS. 4A-4B), the second bootstrap control signal PH2 also controls the driving power control switch 242 to conduct the voltage VCB+ of the first bootstrap node CB+ to be the power for driving the upper-gate driver circuit D3 (that is, as shown by the second pumping voltage level "VDDP+VSW" in FIG. 4A, the second pumping voltage level "VDDP+VSW" is supplied as the power for driving the upper-gate driver circuit D3). Accordingly, the upper-gate driver circuit D3 can generate the upper-gate switch driving signal G3 with a proper voltage level to drive the upper-gate switch N3.

Note that, as shown in the embodiment of FIGS. 4A-4B, it is when the voltage VCB+ of the first bootstrap node CB+ is pumped to the second pumping voltage level (that is, "VDDP+VSW" in FIG. 4A) and when the second pumping voltage level is supplied as the power for driving the upper-gate driver circuit D3, that the upper-gate switch N3 is controlled to be conductive. In other words, the upper-gate switch N3 is turned ON by providing an upper-gate switch driving signal G3 having the second pumping voltage level (i.e., VDDP+VSW), which is obtained from the voltage VCB+ of the first bootstrap node CB+.

In another embodiment, the upper-gate driver circuit D3 can adopt, for example but not limited to, the voltage VSW of the switching node SW as its negative power, whereby the voltage across the bootstrap capacitor CB supplies power to the upper-gate driver circuit D3 in a time-shared manner to drive the upper-gate switch N3. In this arrangement wherein the voltage VSW of the switching node SW is used as the negative power, in one embodiment, when it is required to turn off the upper-gate switch N3, the upper-gate driver circuit D3 still requires sufficient voltage to be able to properly control the level of the upper-gate switch signal G3 so as to properly turn off the upper-gate switch N3. In this case, when the upper-gate switch N3 is required to be turned off, the upper-gate driver circuit D3 controls the level of the upper-gate switch signal G3 to be VSW when the voltage VCB+ of the first bootstrap node CB+ is at the second pumping voltage level (i.e., VDDP+VSW), so that the upper-gate switch N3 can be properly turned off. In this arrangement wherein the voltage VSW of the switching node SW is used as the negative power, the charging period and the pumping period required for the voltage VCB+ of the first bootstrap node CB+ can be arranged as that shown in FIG. 4A, so the details thereof are not redundantly repeated here.

Figure 5A:
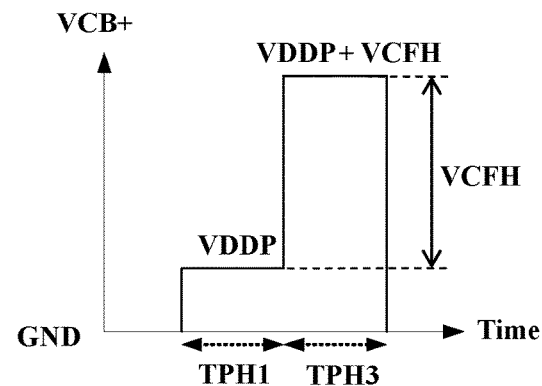
FIGS. 5A-5B show an arrangement of operation waveforms corresponding to the embodiment of FIG. 3.
Figure 5B:
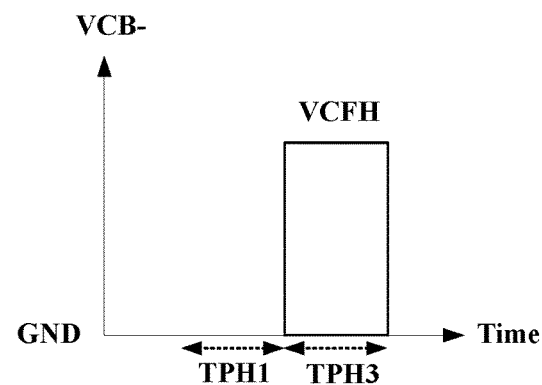

Referring to FIGS. 5A-5B, in this embodiment, to drive the upper-gate switch N4, a charging period is first entered (e.g., referring to the first phase period TPH1 as shown in FIGS. 5A-5B); during the charging period, the first bootstrap control signal PH1 controls the bootstrap capacitor control switch 251 to be conductive, and the second bootstrap control signal PH2 controls the bootstrap capacitor control switch 252 to be non-conductive, and the third bootstrap control signal PH3 controls the bootstrap capacitor control switch 253 to be non-conductive. Consequently, the second bootstrap node CB− is electrically connected to the ground voltage level GND, whereby the supply voltage VDDP charges the bootstrap capacitor CB via the bootstrap diode 26. As shown in FIG. 5A, during the charging period (e.g., referring to the first phase period TPH1 as shown in FIG. 5A), the voltage level of the first bootstrap node CB+, which is VCB+, can be charged up to the voltage level of the supply voltage VDDP. As shown in FIG. 5B, during the charging period (e.g., referring to the first phase period TPH1 as shown in FIG. 5B), the voltage level of the second bootstrap node CB−, which is VCB−, is equal to GND. The first phase period TPH1 corresponds to the charging period.

Subsequently, a pumping period is entered (e.g., referring to the third phase period TPH3 as shown in FIGS. 5A-5B); during the pumping period, the third bootstrap control signal PH3 controls the bootstrap capacitor control switch 253 to be conductive. The first bootstrap control signal PH1 controls the bootstrap capacitor control switch 251 to be non-conductive. The second bootstrap control signal PH2 controls the bootstrap capacitor control switch 252 to be non-conductive. Consequently, the second bootstrap node CB− is electrically connected to the upper-gate node CFH, whereby the voltage VCB+ of the first bootstrap node CB+ is pumped to a first pumping voltage level, and the first pumping voltage level is supplied as a power for driving the upper-gate driver circuit D4. The pumping period corresponds to the third phase period TPH3.

As shown in FIG. 5A, during the pumping period (e.g., referring to the third phase period TPH3 as shown in FIG. 5A), the first pumping voltage level is related to the supply voltage VDDP and the voltage VCFH of the upper-gate node CFH. For example, the first pumping voltage level can be equal to a sum of the supply voltage VDDP and the voltage VCFH of the upper-gate node CFH (e.g., referring to FIG.

5A, the voltage level of VCB+ is equal to a sum of the supply voltage VDDP and the voltage VCFH of the upper-gate node CFH).

While driving the upper-gate switch N4, during the pumping period (e.g., referring to the third phase period TPH3 as shown in FIGS. 5A-5B), the third bootstrap control signal PH3 also controls the driving power control switch 243 to conduct the voltage VCB+ of the first bootstrap node CB+ to be the power for driving the upper-gate driver circuit D4 (that is, as shown by the first pumping voltage level of "VDDP+VCFH" in FIG. 5A, the first pumping voltage level "VDDP+VCFH" is supplied as the power for driving the upper-gate driver circuit D4). Accordingly, the upper-gate driver circuit D4 can generate the upper-gate driving signal G4 with a proper voltage level to drive the upper-gate switch N4.

Note that, as shown in the embodiment of FIGS. 5A-5B, it is when the voltage VCB+ of the first bootstrap node CB+ is pumped to the first pumping voltage level (that is, as shown by the "VDDP+VCFH" in FIG. 5A) and when the first pumping voltage level is supplied as the power for driving the upper-gate driver circuit D4, that the upper-gate switch N4 is controlled to be conductive. In other words, the upper-gate switch N4 is turned ON by providing an upper-gate switch driving signal D4 having the first pumping voltage level (i.e., VDDP+VCFH), which is obtained from the voltage VCB+ of the first bootstrap node CB+.

In another embodiment, the upper-gate driver circuit D4 can adopt, for example but not limited to, the voltage VCFH of the upper-gate node CFH as its negative power, whereby the voltage across the bootstrap capacitor CB supplies power to the upper-gate driver circuit D4 in a time-shared manner to drive the upper-gate switch N4. In this arrangement wherein the voltage VCFH of the upper-gate node CFH is used as the negative power, in one embodiment, when it is required to turn off the upper-gate switch N4, the upper-gate driver circuit D4 still requires sufficient voltage to be able to properly control the level of the upper-gate switch signal G4, so as to properly turn off the upper-gate switch N4. In this case, when the upper-gate switch N4 is required to be turned off, the upper-gate driver circuit D4 controls the level of the upper-gate switch signal G4 to be VCFH when the voltage VCB+ of the first bootstrap node CB+ is at the first pumping voltage level (i.e., VDDP+VCFH), so that the upper-gate switch N4 can be properly turned off. In this arrangement wherein the voltage VCFH of the upper-gate node CFH is used as the negative power, the charging period and the pumping period required for the voltage VCB+ of the first bootstrap node CB+ can be arranged as that shown in FIG. 5A, so the details thereof are not redundantly repeated here.

The embodiments shown in FIGS. 4A-4B and FIGS. 5A-5B can be applied to circumstances where the upper-gate switch N4 and the upper-gate switch N3 are not controlled to be conductive at the same time. Nevertheless, it is possible in some applications that the upper-gate switch N4 and the upper-gate switch N3 are required to be conductive at the same time. To meet such a requirement, the present invention can perform the following operation mechanism.

Figure 6A:
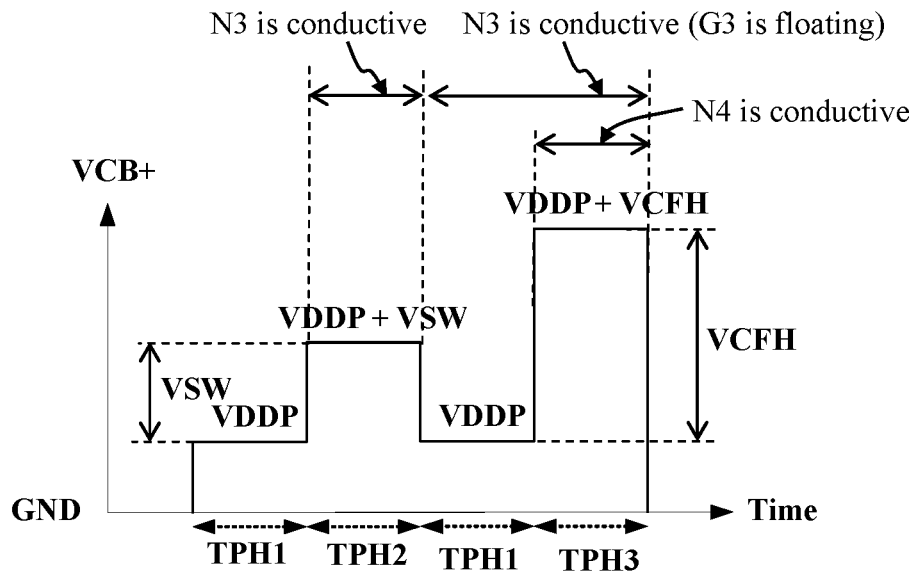
FIGS. 6A-6B show an arrangement of operation waveforms corresponding to the embodiment of FIG. 3.
Figure 6B:
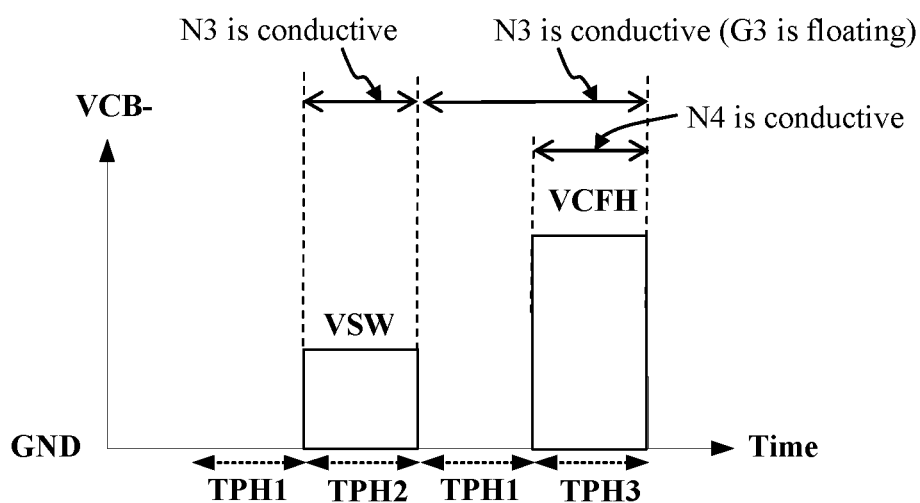

Please refer to FIGS. 6A-6B. FIGS. 6A-6B show an arrangement of operation waveforms corresponding to the embodiment of FIG. 3.

In the embodiment shown in FIGS. 6A-6B, to drive the upper-gate switch N3, during the pumping period (e.g., referring to the second phase period TPH2 as shown in FIGS. 6A-6B), the voltage VCB+ of the first bootstrap node CB+ is pumped to the second pumping voltage level (that is, as shown by the second pumping voltage level of "VDDP+ VSW" in FIG. 6A) and the second pumping voltage level is supplied as the power for driving the upper-gate driver circuit D3, whereby the upper-gate switch N3 is controlled to be conductive. After the upper-gate switch N3 is controlled to be conductive, the upper-gate driver circuit D3 controls the upper-gate driving signal G3 to be floating and maintains the upper-gate switch N3 to be conductive.

Under a situation where the upper-gate driving signal G3 is floating and the upper-gate switch N3 is conductive, during another charging period (e.g., as shown by another first phase period TPH1 immediately following the second phase period TPH2 in FIGS. 6A-6B), the bootstrap capacitor CB is charged by the supply voltage VDDP via the bootstrap diode 26, and during another pumping period that immediately follows (e.g., as shown by a third phase period TPH3 in FIGS. 6A-6B), the voltage VCB+ of the first bootstrap node CB+ is pumped to another pumping voltage level (that is, as shown by the first pumping voltage level of "VDDP+ VCFH" in FIG. 6A), and the voltage VCB+ of the first bootstrap node CB+ is supplied as the power for the upper-gate driver circuit D4, whereby the upper-gate driver circuit D4 is controlled to be conductive at the same time.

Thus, the embodiment shown in FIGS. 6A-6B is different from the embodiments shown in FIGS. 4A-4B and FIGS. 5A-5B in that: in the embodiments shown in FIGS. 6A-6B, the upper-gate switch N4 and the upper-gate switch N3 are controlled to be conductive at the same time via the above-mentioned operation mechanism.

Note that, in the above-mentioned embodiment shown in FIGS. 6A-6B, it is arranged that, while the upper-gate driving signal G3 is floating and the upper-gate switch N3 is maintained conductive, the upper-gate driving signal G4 drives the upper-gate switch N4 to be conductive. However, in a different embodiment, it is also practicable and within the scope of the present invention to interchange the operation mechanisms of the upper-gate switch N4 and the upper-gate switch N3. That is, the upper-gate switch N4 is first controlled to be conductive via the upper-gate driving signal G4, and after the upper-gate switch N4 has become conductive, the upper-gate driving signal G4 is subsequently controlled to be floating and the upper-gate switch N4 is maintained conductive. Then, the upper-gate driving signal G3 drives the upper-gate switch N3 to become conductive.

To control the upper-gate driving signal G3 to be floating can be embodied in any suitable way. For example, the driving switch of the upper-gate driver circuit D3 can be directly turned OFF, or another switch can be employed to control the upper-gate driving signal G3 to be floating, or by other means. Those skilled in this art can readily conceive variations and modifications within the spirit of the present invention.

Note that, in the above-mentioned embodiment wherein plural upper-gate switches (e.g., the upper-gate switch N4 and the upper-gate switch N3) are conductive at the same time via controlling at least one upper-gate driving signal to be floating, when it is necessary to turn off any one of the upper-gate switches N4 or N3, the operation mechanism for turning off the upper-gate switch N4 or the upper-gate switch N3 is substantially the same as that described with respect to the embodiments shown in FIGS. 4A-4B and FIGS. 5A-5B. That is, the upper-gate driver circuit (D3 or D4) requires sufficient voltage to be able to properly control the level of the upper-gate switch signal (G3 or G4) to turn off the upper-gate switch (N3 or N4), as referring to the description for the embodiments shown in FIGS. 4A-4B and FIGS. 5A-5B.

In one embodiment, when the multi-level switching power converter circuit operates under a certain operation status, the voltage VSW of the switching node SW and the voltage VCFH of the upper-gate node CFH can be constants. However, in another embodiment, when the multi-level switching power converter circuit operates under another operation status, the voltage VSW of the switching node SW and the voltage VCFH of the upper-gate node CFH can be variables; for example, in some applications or under some operation statuses, the voltage VSW of the switching node SW and/or the voltage VCFH of the upper-gate node CFH may rise up or fall down.

Figure 7A:
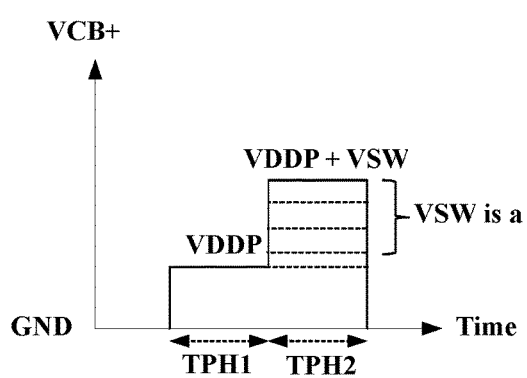
FIGS. 7A-7B show an arrangement of operation waveforms corresponding to the embodiment of FIG. 3.
Figure 8A:
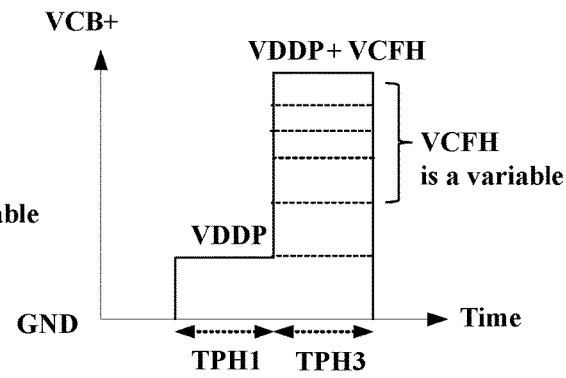
FIGS. 8A-8B show an arrangement of operation waveforms corresponding to the embodiment of FIG. 3.
Figure 7B:
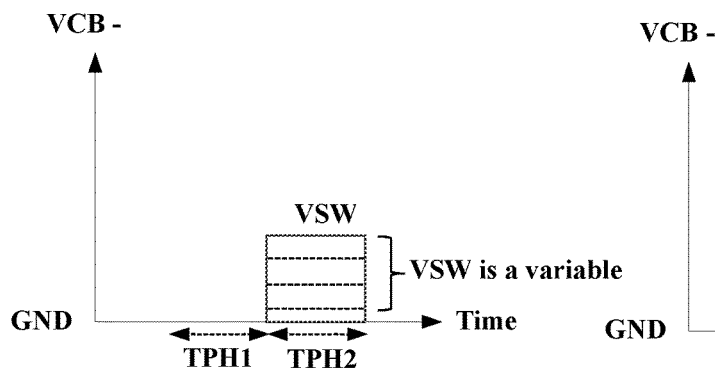
Figure 8B:
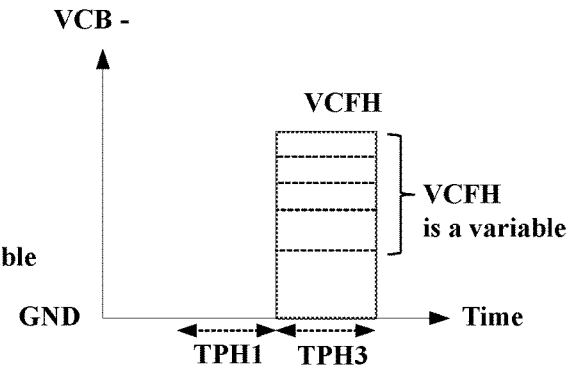
Figure 9A:
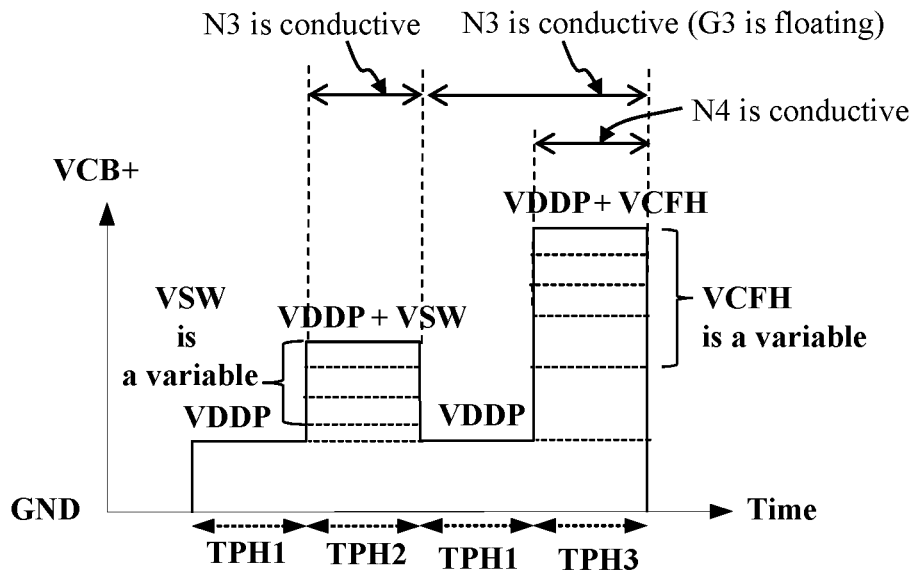
FIGS. 9A-9B show an arrangement of operation waveforms corresponding to the embodiment of FIG. 3.
Figure 9B:
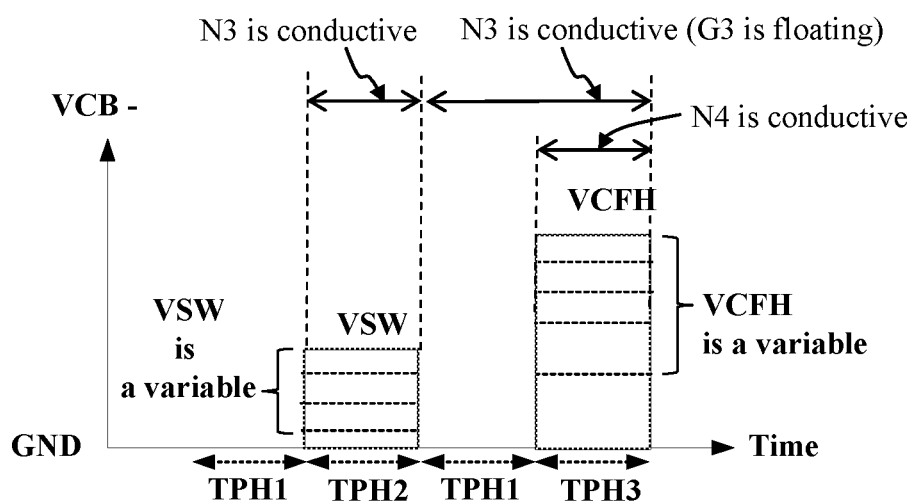

Please refer to the embodiments shown in FIGS. 7A-7B, FIGS. 8A-8B and FIGS. 9A-9B. FIGS. 7A-7B show an arrangement of operation waveforms corresponding to the embodiment of FIG. 3, wherein the voltage VSW of the switching node SW is a variable. FIGS. 8A-8B show an arrangement of operation waveforms corresponding to the embodiment of FIG. 3, wherein the voltage VCFH of the upper-gate node CFH is a variable. FIGS. 9A-9B show an arrangement of operation waveforms corresponding to the embodiment of FIG. 3, wherein both the voltage VSW of the switching node SW and the voltage VCFH of the upper-gate node CFH are variables.

As the waveforms illustrate, the embodiments shown in FIGS. 7A-7B, FIGS. 8A-8B and FIGS. 9A-9B have substantially the same advantages and efficacies as the embodiments shown in FIGS. 4A-4B, FIGS. 5A-5B and FIGS. 6A-6B, which are: in the present invention, the switching power conversion apparatus 200 and multi-level switching power converter circuit 40 therein are capable of providing highly efficient power conversion operation and the present invention is thus more cost-effective.

Note that, according to the spirit of the present invention, the above-mentioned "multi-level" is not limited to three-level. When there are more than three levels, the above-mentioned circuits can be corresponding modified and the number of circuits can be increased as required, depending upon the actual levels needed. Those skilled in this art can readily conceive variations and modifications within the spirit of the present invention. For example, a three-level or more level multi-level switching power converter circuit can include plural upper-gate switches and plural lower-gate switches, wherein the upper-gate switches are connected in series to form an upper-gate switch group and the lower-gate switches are connected in series to form a lower-gate switch group. The upper-gate switch group can be coupled between the first voltage V1 and the switching node SW; the upper-gate switch group can include one or more upper-gate nodes and each one upper-gate node is coupled between two corresponding upper-gate switches. The lower-gate switch group can be coupled between a ground voltage level GND and the switching node SW; the lower-gate switch group can include one or more lower-gate nodes and each lower-gate node is coupled between two corresponding lower-gate switches. Besides, in one embodiment, one end of the conversion capacitor is coupled to one of the upper-gate nodes and another end of the conversion capacitor is coupled to one of the lower-gate nodes. Under such arrangement, the above-mentioned upper-gate switches and lower-gate switches are configured to operably switch the coupling relationship among the conversion capacitor CF, the inductor L, the first voltage V1, the switching node SW and the ground voltage level GND, so that the voltage of the switching node is switched among at least three switching voltage levels, thereby achieving multi-level switching power conversion to convert the first voltage V1 to the second voltage V2 or to convert the second voltage V2 to the first voltage V1. In one embodiment, the at least three switching voltage level includes a voltage level which is 1/k of the voltage level of the first voltage, in which k is a real number.

The present invention has been described in considerable detail with reference to certain preferred embodiments thereof. It should be understood that the description is for illustrative purpose, not for limiting the scope of the present invention. An embodiment or a claim of the present invention does not need to achieve all the objectives or advantages of the present invention. The title and abstract are provided for assisting searches but not for limiting the scope of the present invention. Those skilled in this art can readily conceive variations and modifications within the spirit of the present invention. For example, a device which does not substantially influence the primary function of a signal can be inserted between two devices or circuits shown to be indirect connection in the embodiments, such as a switch or a resistor. It is not limited for each of the embodiments described herein before to be used alone; under the spirit of the present invention, two or more of the embodiments described hereinbefore can be used in combination. For example, two or more of the embodiments can be used together, or, a part of one embodiment can be used to replace a corresponding part of another embodiment. In view of the foregoing, the spirit of the present invention should cover all such and other modifications and variations, which should be interpreted to fall within the scope of the following claims and their equivalents.

What is claimed is:

1. A switching power conversion apparatus which is configured to operably convert a first voltage to a second voltage or convert the second voltage to the first voltage, the switching power conversion apparatus comprising:

an inductor having one end electrically connected to the second voltage and having another end electrically connected to a switching node;

a multi-level switching power converter circuit coupled to the inductor via the switching node;

a conversion capacitor, which is coupled to the multi-level switching power converter circuit;

a bootstrap diode having a current input terminal coupled to a supply voltage and having a current output terminal coupled to a first bootstrap node; and a bootstrap capacitor having one end coupled to the first bootstrap node, and having another end which is coupled to the multi-level switching power converter circuit via a second bootstrap node;

wherein the multi-level switching power converter circuit includes:

a multi-level power stage, including:

a plurality of upper-gate switches which are connected in series to form an upper-gate switch group, the upper-gate switch group being coupled between the first voltage and the switching node, wherein the upper-gate switch group includes one or more upper-gate nodes, and each one of the upper-gate nodes is coupled between two corresponding upper-gate switches; and a plurality of lower-gate switches which are connected in series to form a lower-gate switch group, the lower-gate switch group being coupled between a ground voltage level and the switching node, wherein the lower-gate switch group includes one or more lower-gate nodes, and each one of the lower-gate nodes is coupled between two corresponding lower-gate switches;

wherein, the conversion capacitor having one end coupled to one of the upper-gate nodes and having another end coupled to one of the lower-gate nodes;

wherein, the plurality of upper-gate switches and the plurality of lower-gate switches are configured to operably switch a coupling relationship among the conversion capacitor, the inductor, the first voltage, the switching node and the ground voltage level, so that a voltage of the switching node is switched among at least three switching voltage levels, thereby achieving multi-level switching power conversion to convert the first voltage to the second voltage or convert the second voltage to the first voltage;

a pulse width modulation (PWM) control circuit, which is configured to operably generate a PWM signal and a bootstrap control signal;

a multi-level driver circuit, which includes a plurality of sub-driver circuits configured to operably generate a plurality of corresponding upper-gate driving signals and a plurality of corresponding lower-gate driving signals according to the PWM signal, wherein the plurality of upper-gate driving signals and the plurality of lower-gate driving signals are configured to operably drive the corresponding upper-gate switches and the corresponding lower-gate switches, respectively;

a bootstrap capacitor control circuit including a plurality of bootstrap capacitor control switches, wherein the bootstrap capacitor control switches are coupled together at a first end of each of the bootstrap capacitor control switches, whereas, each of the bootstrap capacitor control switches has a second end and the second ends are coupled to one of the upper-gate nodes, the switch node and the ground voltage level, respectively; wherein, during a charging period, the bootstrap control signal controls the plurality of bootstrap capacitor control switches to electrically connect the second bootstrap node to the ground voltage level, whereby the supply voltage charges the bootstrap capacitor via the bootstrap diode, and wherein, during a pumping period, the bootstrap control signal controls the plurality of bootstrap capacitor control switches to electrically connect the second bootstrap node to one of the upper-gate nodes or the switching node, whereby the voltage of the first bootstrap node is pumped to a corresponding pumping voltage level; and a driving power control circuit including a plurality of driving power control switches, wherein during the pumping period, the bootstrap control signal controls the plurality of driving power control switches to supply the voltage of the first bootstrap node as a power for corresponding ones of the sub-driver circuits, such that the corresponding ones of the sub-driver circuits generate corresponding driving signals to drive the upper-gate switches.

2. The switching power conversion apparatus of claim 1, wherein the at least three switching voltage level includes a voltage level which is 1/k of a voltage level of the first voltage, in which k is a real number.

3. The switching power conversion apparatus of claim 1, wherein the at least three switching voltage level includes a voltage level which is ½ of a voltage level of the first voltage, the voltage level of the first voltage and the ground voltage level.

4. The switching power conversion apparatus of claim 3, wherein the multi-level power stage includes a first upper-gate switch, a second upper-gate switch, a first lower-gate switch and a second lower-gate switch;

wherein, the first upper-gate switch and the second upper-gate switch are coupled in series between the first voltage and the switching node, to form the upper-gate switch group, the first upper-gate switch and the second upper-gate switch being commonly coupled to the corresponding upper-gate node;

the first lower-gate switch and the second lower-gate switch are coupled in series between the ground voltage level and the switching node, to form the lower-gate switch group, the first lower-gate switch and the second lower-gate switch being commonly coupled to the corresponding lower-gate node; and the conversion capacitor is coupled between the upper-gate node and the lower-gate node.

5. The switching power conversion apparatus of claim 4, wherein the plurality of sub-driver circuits includes a first upper-gate driver circuit, a second upper-gate driver circuit, a first lower-gate driver circuit and a second lower-gate driver circuit, which are configured to operably generate the plurality of upper-gate driving signals and the plurality of lower-gate driving signals according to the PWM signal, respectively;

wherein, the plurality of upper-gate driving signals include a first upper-gate driving signal and a second upper-gate driving signal, which are configured to operably control the first upper-gate switch and the second upper-gate switch, respectively;

wherein, the plurality of lower-gate driving signals includes a first lower-gate driving signal and a second lower-gate driving signal, which are configured to operably control the first lower-gate switch and the second lower-gate switch, respectively.

6. The switching power conversion apparatus of claim 5, wherein the plurality of bootstrap capacitor control switches includes a first bootstrap capacitor control switch, a second bootstrap capacitor control switch and a third bootstrap capacitor control switch;

wherein, each of the first bootstrap capacitor control switch, the second bootstrap capacitor control switch and the third bootstrap capacitor control switch has one end coupled to the second bootstrap node;

wherein, the first bootstrap capacitor control switch has its another end coupled to the upper-gate node, the second bootstrap capacitor control switch has its another end coupled to the switching node and the third bootstrap capacitor control switch has its another end coupled to the ground voltage level;

wherein, to drive the first upper-gate switch, a first phase period is first entered; during the first phase period, the bootstrap control signal controls the first bootstrap capacitor control switch, the second bootstrap capacitor control switch and the third bootstrap capacitor control switch, so as to electrically connect the second bootstrap node to the ground voltage level, whereby the supply voltage charges the bootstrap capacitor via the bootstrap diode; thereafter, a third phase period is entered; during the third phase period, the second bootstrap node is electrically connected to the upper-gate node, whereby the voltage of the first bootstrap node is pumped to a first pumping voltage level, so that the first pumping voltage level is supplied as a power for driving the first upper-gate driver circuit;

wherein, to drive the second upper-gate switch, the first phase period is entered; during the first phase period, the bootstrap control signal controls the first bootstrap capacitor control switch, the second bootstrap capacitor control switch and the third bootstrap capacitor control switch, so as to electrically connect the second bootstrap node to the ground voltage level, whereby the supply voltage charges the bootstrap capacitor via the bootstrap diode; thereafter, a second phase period is entered; during the second phase period, the second bootstrap node is electrically connected to the switching node, whereby the voltage of the first bootstrap node is pumped to a second pumping voltage level, so that the second pumping voltage level is supplied as a power for driving the second upper-gate driver circuit;

wherein, the first pumping voltage level is related to the supply voltage and the voltage of the first bootstrap node, whereas, the second pumping voltage level is related to the supply voltage and the voltage of the switching node;

wherein, the first phase period corresponds to the charging period, whereas, the second phase period and/or the third phase period corresponds to the pumping period.

7. The switching power conversion apparatus of claim 6, wherein the plurality of driving power control switches include: a first driving power control switch and a second driving power control switch; wherein, the first driving power control switch and the second driving power control switch have their one end commonly coupled to the first bootstrap node, the first driving power control switch having its another end coupled to the first upper-gate driver circuit, the second driving power control switch having its another end coupled to the second upper-gate driver circuit;

wherein, to drive the first upper-gate switch, during the third phase period, the bootstrap control signal controls the first driving power control switch, so as to supply the voltage of the first bootstrap node as the power for the first driving power control switch; accordingly, the first driving power control switch generates the first upper-gate switch signal for driving the first upper-gate switch; and wherein, to drive the second upper-gate switch, during the second phase period, the bootstrap control signal controls the second driving power control switch, so as to supply the voltage of the first bootstrap node as the power for the second driving power control switch; accordingly, the second driving power control switch generates the second upper-gate switch signal for driving the second upper-gate switch.

8. The switching power conversion apparatus of claim 1, wherein the sub-driver circuits adopt the voltage of the switching node and the voltage of the one or more upper-gate nodes as a negative power, respectively, whereby a voltage across the bootstrap capacitor supplies power to the sub-driver circuits in a time-shared manner to drive the upper-gate switches respectively.

9. The switching power conversion apparatus of claim 1, wherein each of the upper-gate switches is controlled to be conductive when the voltage of the first bootstrap node is pumped to the corresponding pumping voltage level and when the first pumping voltage level is supplied as the power for driving the sub-driver circuit corresponding to the upper-gate switch.

10. The switching power conversion apparatus of claim 1, wherein each of the upper-gate switches is controlled to be conductive when the voltage of the first bootstrap node is pumped to the corresponding pumping voltage level and when the first pumping voltage level is supplied as the power for driving the sub-driver circuit corresponding to the upper-gate switch; and after the upper-gate switch is controlled to be conductive, the corresponding sub-driver circuit controls the corresponding driving signal to be floating and maintain the upper-gate switch to be conductive.

11. The switching power conversion apparatus of claim 10, wherein when the driving signal is controlled to be floating and the corresponding upper-gate switch is maintained to be conductive, during another charging period, the bootstrap capacitor is charged with the supply voltage via the bootstrap diode; and, during another pumping period, when the voltage of the first bootstrap node is pumped to another corresponding pumping voltage level and when the voltage of the first bootstrap node is supplied as the power for another sub-driver circuit corresponding to another upper-gate switch, the another upper-gate switches is controlled to be conductive.

12. The switching power conversion apparatus of claim 1, wherein the voltage of the switching node and/or the voltage of the at least one upper-gate node is a variable.

13. The switching power conversion apparatus of claim 1, wherein the plurality of upper-gate switches and the plurality of lower-gate switches include transistor switches having same conductivity types.

14. The switching power conversion apparatus of claim 13, wherein the plurality of upper-gate switches and the plurality of lower-gate switches includes NMOS transistor switches.

15. A multi-level switching power converter circuit for use in a switching power conversion apparatus, the switching power conversion apparatus being configured to operably convert a first voltage to a second voltage or convert the second voltage to the first voltage, the switching power conversion apparatus comprising: an inductor having one end electrically connected to the second voltage and having another end electrically connected to a switching node; a conversion capacitor, which is coupled to the multi-level switching power converter circuit; a bootstrap diode having a current input terminal coupled to a supply voltage and having a current output terminal coupled to a first bootstrap node; and a bootstrap capacitor having one end coupled to the first bootstrap node, and having another end which is coupled to the multi-level switching power converter circuit via a second bootstrap node; the multi-level switching power converter circuit being coupled to the inductor via the switching node, and the multi-level switching power converter circuit comprising:

a multi-level power stage, including:

a plurality of upper-gate switches which are connected in series to form an upper-gate switch group, the upper-gate switch group being coupled between the first voltage and the switching node, wherein the upper-gate switch group includes one or more upper-gate nodes, and each one of the upper-gate nodes is coupled between two corresponding upper-gate switches; and a plurality of lower-gate switches which are connected in series to form a lower-gate switch group, the lower-gate switch group being coupled between a ground voltage level and the switching node, wherein the lower-gate switch group includes one or more lower-gate nodes, and each one of the lower-gate nodes is coupled between two corresponding lower-gate switches;

wherein, the conversion capacitor having one end coupled to one of the upper-gate nodes and having another end coupled to one of the lower-gate nodes;

wherein, the plurality of upper-gate switches and the plurality of lower-gate switches are configured to operably switch a coupling relationship among the conversion capacitor, the inductor, the first voltage, the switching node and the ground voltage level, so that a voltage of the switching node is switched among at least three switching voltage levels, thereby achieving multi-level switching power conversion to convert the first voltage to the second voltage or convert the second voltage to the first voltage;

a pulse width modulation (PWM) control circuit, which is configured to operably generate a PWM signal and a bootstrap control signal;

a multi-level driver circuit, which includes a plurality of sub-driver circuits configured to operably generate a plurality of corresponding upper-gate driving signals and a plurality of corresponding lower-gate driving signals according to the PWM signal, wherein the plurality of upper-gate driving signals and the plurality of lower-gate driving signals are configured to operably drive the corresponding upper-gate switches and the corresponding lower-gate switches, respectively;

a bootstrap capacitor control circuit including a plurality of bootstrap capacitor control switches, wherein the bootstrap capacitor control switches are coupled together at a first end of each of the bootstrap capacitor control switches, whereas, each of the bootstrap capacitor control switches has a second end and the second ends are coupled to one of the upper-gate nodes, the switch node and the ground voltage level, respectively; wherein, during a charging period, the bootstrap control signal controls the plurality of bootstrap capacitor control switches to electrically connect the second bootstrap node to the ground voltage level, whereby the supply voltage charges the bootstrap capacitor via the bootstrap diode, and wherein, during a pumping period, the bootstrap control signal controls the plurality of bootstrap capacitor control switches to electrically connect the second bootstrap node to one of the upper-gate nodes or the switching node, whereby the voltage of the first bootstrap node is pumped to a corresponding pumping voltage level; and a driving power control circuit including a plurality of driving power control switches, wherein during the pumping period, the bootstrap control signal controls the plurality of driving power control switches to supply the voltage of the first bootstrap node as a power for corresponding ones of the sub-driver circuits, such that the corresponding ones of the sub-driver circuits generate corresponding driving signals to drive the upper-gate switches.

16. The multi-level switching power converter circuit of claim 15, wherein the at least three switching voltage level includes a voltage level which is 1/k of a voltage level of the first voltage, in which k is a real number.

17. The multi-level switching power converter circuit of claim 15, wherein the at least three switching voltage level includes a voltage level which is ½ of a voltage level of the first voltage, the voltage level of the first voltage and the ground voltage level.

18. The multi-level switching power converter circuit of claim 17, wherein the multi-level power stage includes a first upper-gate switch, a second upper-gate switch, a first lower-gate switch and a second lower-gate switch;

wherein, the first upper-gate switch and the second upper-gate switch are coupled in series between the first voltage and the switching node, to form the upper-gate switch group, the first upper-gate switch and the second upper-gate switch being commonly coupled to the corresponding upper-gate node;

the first lower-gate switch and the second lower-gate switch are coupled in series between the ground voltage level and the switching node, to form the lower-gate switch group, the first lower-gate switch and the second lower-gate switch being commonly coupled to the corresponding lower-gate node; and the conversion capacitor is coupled between the upper-gate node and the lower-gate node.

19. The multi-level switching power converter circuit of claim 18, wherein the plurality of sub-driver circuits includes a first upper-gate driver circuit, a second upper-gate driver circuit, a first lower-gate driver circuit and a second lower-gate driver circuit, which are configured to operably generate the plurality of upper-gate driving signals and the plurality of lower-gate driving signals according to the PWM signal, respectively;

wherein, the plurality of upper-gate driving signals include a first upper-gate driving signal and a second upper-gate driving signal, which are configured to operably control the first upper-gate switch and the second upper-gate switch, respectively;

wherein, the plurality of lower-gate driving signals includes a first lower-gate driving signal and a second lower-gate driving signal, which are configured to operably control the first lower-gate switch and the second lower-gate switch, respectively.

20. The multi-level switching power converter circuit of claim 19, wherein the plurality of bootstrap capacitor control switches includes a first bootstrap capacitor control switch, a second bootstrap capacitor control switch and a third bootstrap capacitor control switch;

wherein, each of the first bootstrap capacitor control switch, the second bootstrap capacitor control switch and the third bootstrap capacitor control switch has one end coupled to the second bootstrap node;

wherein, the first bootstrap capacitor control switch has its another end coupled to the upper-gate node, the second bootstrap capacitor control switch has its another end coupled to the switching node and the third bootstrap capacitor control switch has its another end coupled to the ground voltage level;

wherein, to drive the first upper-gate switch, a first phase period is first entered; during the first phase period, the bootstrap control signal controls the first bootstrap capacitor control switch, the second bootstrap capacitor control switch and the third bootstrap capacitor control switch, so as to electrically connect the second bootstrap node to the ground voltage level, whereby the supply voltage charges the bootstrap capacitor via the bootstrap diode; thereafter, a third phase period is entered; during the third phase period, the second bootstrap node is electrically connected to the upper-gate node, whereby the voltage of the first bootstrap node is pumped to a first pumping voltage level, so that the first pumping voltage level is supplied as a power for driving the first upper-gate driver circuit;

wherein, to drive the second upper-gate switch, the first phase period is entered; during the first phase period, the bootstrap control signal controls the first bootstrap capacitor control switch, the second bootstrap capacitor control switch and the third bootstrap capacitor control switch, so as to electrically connect the second bootstrap node to the ground voltage level, whereby the supply voltage charges the bootstrap capacitor via the bootstrap diode; thereafter, a second phase period is entered; during the second phase period, the second bootstrap node is electrically connected to the switching node, whereby the voltage of the first bootstrap node is pumped to a second pumping voltage level, so that the second pumping voltage level is supplied as a power for driving the second upper-gate driver circuit;

wherein, the first pumping voltage level is related to the supply voltage and the voltage of the first bootstrap node, whereas, the second pumping voltage level is related to the supply voltage and the voltage of the switching node;

wherein, the first phase period corresponds to the charging period, whereas, the second phase period and/or the third phase period corresponds to the pumping period.

21. The multi-level switching power converter circuit of claim 20, wherein the plurality of driving power control switches include: a first driving power control switch and a second driving power control switch; wherein, the first driving power control switch and the second driving power control switch have their one end commonly coupled to the first bootstrap node, the first driving power control switch having its another end coupled to the first upper-gate driver circuit, the second driving power control switch having its another end coupled to the second upper-gate driver circuit;

wherein, to drive the first upper-gate switch, during the third phase period, the bootstrap control signal controls the first driving power control switch, so as to supply the voltage of the first bootstrap node as the power for the first driving power control switch; accordingly, the first driving power control switch generates the first upper-gate switch signal for driving the first upper-gate switch; and wherein, to drive the second upper-gate switch, during the second phase period, the bootstrap control signal controls the second driving power control switch, so as to supply the voltage of the first bootstrap node as the power for the second driving power control switch; accordingly, the second driving power control switch generates the second upper-gate switch signal for driving the second upper-gate switch.

22. The multi-level switching power converter circuit of claim 15, wherein the sub-driver circuits adopt the voltage of the switching node and the voltage of the one or more upper-gate nodes as a negative power, respectively, whereby a voltage across the bootstrap capacitor supplies power to the sub-driver circuits in a time-shared manner to drive the upper-gate switches respectively.

23. The multi-level switching power converter circuit of claim 15, wherein each of the upper-gate switches is controlled to be conductive when the voltage of the first bootstrap node is pumped to the corresponding pumping voltage level and when the first pumping voltage level is supplied as the power for driving the sub-driver circuit corresponding to the upper-gate switch.

24. The multi-level switching power converter circuit of claim 15, wherein each of the upper-gate switches is controlled to be conductive when the voltage of the first bootstrap node is pumped to the corresponding pumping voltage level and when the first pumping voltage level is supplied as the power for driving the sub-driver circuit corresponding to the upper-gate switch; and after the upper-gate switch is controlled to be conductive, the corresponding sub-driver circuit controls the corresponding driving signal to be floating and maintain the upper-gate switch to be conductive.

25. The multi-level switching power converter circuit of claim 24, wherein when the driving signal is controlled to be floating and the corresponding upper-gate switch is maintained to be conductive, during another charging period, the bootstrap capacitor is charged with the supply voltage via the bootstrap diode; and, during another pumping period, when the voltage of the first bootstrap node is pumped to another corresponding pumping voltage level and when the voltage of the first bootstrap node is supplied as the power for another sub-driver circuit corresponding to another upper-gate switch, the another upper-gate switches is controlled to be conductive.

26. The multi-level switching power converter circuit of claim 15, wherein the voltage of the switching node and/or the voltage of the at least one upper-gate node is a variable.

27. The multi-level switching power converter circuit of claim 15, wherein the plurality of upper-gate switches and the plurality of lower-gate switches include transistor switches having same conductivity types.

28. The multi-level switching power converter circuit of claim 27, wherein the plurality of upper-gate switches and the plurality of lower-gate switches includes NMOS transistor switches.

* * * * *